United States Patent
Sandhu et al.

(10) Patent No.: US 6,749,717 B1
(45) Date of Patent: Jun. 15, 2004

(54) DEVICE FOR IN-SITU CLEANING OF AN INDUCTIVELY-COUPLED PLASMA CHAMBERS

(75) Inventors: Gurtej S. Sandhu, Boise, ID (US); Sujit Sharan, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/439,314

(22) Filed: Nov. 12, 1999

Related U.S. Application Data

(63) Continuation-in-part of application No. 08/795,379, filed on Feb. 4, 1997.

(51) Int. Cl.⁷ .......................... H05H 1/00; C23C 16/00
(52) U.S. Cl. ...................... 156/345.35; 156/345.48; 118/723 I; 118/723 IR; 118/723 ME; 118/723 ER
(58) Field of Search ................... 156/345.48, 345.35; 118/723 I, 723 IR, 723 ME, 723 ER

(56) References Cited

U.S. PATENT DOCUMENTS

| | | | |
|---|---|---|---|
| 4,795,880 A | 1/1989 | Hayes et al. | 219/121.52 |
| 4,820,377 A | 4/1989 | Davis et al. | 156/643 |
| 4,878,994 A | 11/1989 | Jucha et al. | 156/643 |
| 5,240,739 A | 8/1993 | Doan et al. | 427/126.1 |
| 5,252,518 A | 10/1993 | Sandhu et al. | 437/200 |
| 5,368,687 A | 11/1994 | Sandhu et al. | 156/664 |
| 5,384,289 A | 1/1995 | Westmoreland | 437/245 |
| 5,389,195 A | 2/1995 | Ouderkirk et al. | 156/643 |
| 5,389,496 A | 2/1995 | Calvert et al. | 430/315 |
| 5,393,709 A | 2/1995 | Lur et al. | 437/228 |
| 5,409,563 A | 4/1995 | Cathey | 156/643 |
| 5,514,246 A | 5/1996 | Blalock | 156/643.1 |
| 5,573,597 A * | 11/1996 | Lantsman | 118/723 E |
| 5,614,055 A | 3/1997 | Fairbairn et al. | 156/345 |
| 5,788,778 A * | 8/1998 | Shang et al. | 156/345 |
| 5,788,799 A | 8/1998 | Steger et al. | 156/345 |
| 5,792,272 A | 8/1998 | van Os et al. | 118/723 IR |
| 5,812,403 A | 9/1998 | Fong et al. | 364/468.28 |
| 5,817,534 A | 10/1998 | Ye et al. | 438/10 |
| 5,824,607 A | 10/1998 | Trow et al. | 438/732 |
| 5,834,371 A | 11/1998 | Ameen et al. | 438/656 |
| 5,844,195 A | 12/1998 | Fairbairn et al. | 219/121.43 |
| 5,916,455 A * | 6/1999 | Kumagai | 156/345 |
| 5,989,345 A * | 11/1999 | Hatano | 118/715 |
| 6,170,428 B1 | 1/2001 | Redeker et al. | 118/723 I |
| 6,182,602 B1 * | 2/2001 | Redeker et al. | 118/723 R |

FOREIGN PATENT DOCUMENTS

EP  0822582 A2 *  2/1998  ......... H01L/21/306

OTHER PUBLICATIONS

"Advanced Plasma Sources: What's Working?," *Semiconductor International*, pp. 56–58, 60, May 1984.

* cited by examiner

*Primary Examiner*—Parviz Hassanzadeh
(74) *Attorney, Agent, or Firm*—Charles Brantley

(57) ABSTRACT

The present invention is a process for plasma enhanced fabrication of conductive materials on a substrate comprising the steps of placing substrate in an inductively coupled (IC) plasma reaction chamber and maintaining the chamber under vacuum pressure while introducing at least a preselected reactant species gas, and optionally a carrier gas into the chamber for a preselected fabrication procedure on the substrate. A plasma is generated from the gas or gases within the chamber using a power source inductively coupled to the reaction chamber. After the consequent fabrication procedure the substrate is removed from the chamber; and any conductive material is in-situ removed from the inside of the chamber to remove any blocking of the inductive power couple to the reaction chamber.

29 Claims, 3 Drawing Sheets

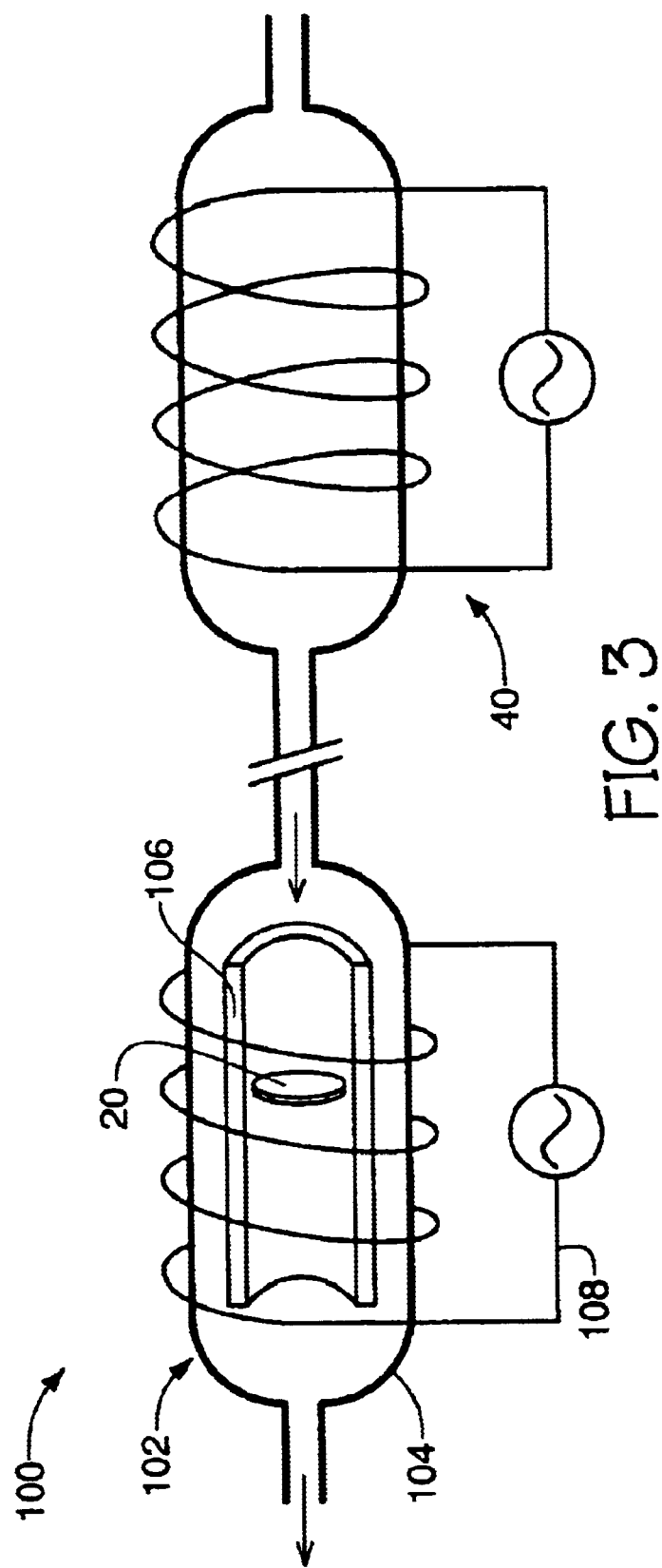

DEVICE FOR IN-SITU CLEANING OF AN INDUCTIVELY-COUPLED PLASMA CHAMBERS

RELATED APPLICATION

This application is a continuation of pending U.S. application Ser. No. 08/795,379 filed Feb. 4, 1997.

BACKGROUND OF THE INVENTION

1. Technical Field

This invention relates to integrated circuit manufacturing processes and, more specifically, to a novel process for plasma fabrication procedures for semiconductor substrates using conductive materials.

2. Background

In order to build an integrated circuit, many active devices need to be fabricated on a single substrate. The current practice in semiconductor manufacturing is to use thin film fabrication techniques. A large variety of materials can be deposited using thin films, including metals, semiconductors insulators and the like. The composition and uniformity of these thin layers must be strictly controlled to facilitate etching of submicron features. The surface of the substrate, most often a wafer, must be planarized in some way to prevent the surface topography from becoming increasingly rough with each added thin film level. The formation of such films is accomplished by a large variety of techniques.

Chemical vapor deposition (CVD) processes are often selected over competing deposition techniques because they offer numerous advantages, including the abilities of CVD to deposit films from a wide variety of chemical compositions and provide improved conformality.

In general a CVD process includes the following steps: a selected composition and flow rate of reactant and inert gases are dispatched into a reaction chamber; the gases move to the substrate surface; the reactants are adsorbed on the substrate surface; the species undergo a film-forming chemical reaction and the by-products of the reaction are desorbed from the surface and conveyed away from the surface.

Plasma enhanced CVD (PECVD) uses a plasma or glow discharge with a low pressure gas, to create free electrons which transfer energy into the reactant gases. This allows the substrate to remain at a lower temperature than in other CVD processes. A lower substrate temperature is the major advantage of PECVD and provides film deposition methods for substrates that do not have the thermal stability necessary for other processes that require higher temperature conditions. In addition, PECVD can enhance the deposition rate when compared to thermal reactions alone, and produce films of unique compositions and properties.

In most applications it is desired that thin films maintain a uniform thickness and freedom from cracks or voids. As thin films cross steps that occur on the surface of the underlying substrate, they often suffer unwanted deviations from the ideal conformality, such as thinning or cracking. A measure of how well a film maintains its nominal thickness is referred to as the step coverage of the film. The height of the step and the aspect-ratio (the height-to-spacing ratio of two adjacent steps) of a feature being covered determine the expected step coverage. Step coverage of 100% is ideal, but normally a value less than 100% is specified as acceptable, for any given application.

The semiconductor industry's continuing drive towards closer and smaller device geometries, has placed an increased demand for cost-effective solutions for the problem of higher step coverage and planarization. New plasma sources are being developed because traditional sources cannot extend to the sub-0.5 micron level of processing necessary for the more rigorous device geometries. Fabrication processes that are employed in response to the necessity of good conformality in the face of the submicron geometries include plasma enhanced directional sputtering, plasma enhanced etching and plasma enhanced chemical vapor deposition. CVD processes have been developed for some metals, for example titanium and titanium nitride, both of which can be put to use in 0.35 and 0.25 micron devices. Because these typical back-end-of-the-line (BEOL) fabrication processes must be done at low temperatures (<450° C.) to protect the integrity of previously deposited layers and to ensure that dopants don't diffuse excessively, they are typically based on PECVD, which, as described above, can be achieved at low temperatures. These low temperature, high aspect ratio coverage PECVD process requirements are being met with low pressure, high density plasma (HDP) based processes. To achieve the good step coverage and gap fill desired, HDP CVD systems are run at a high flow rate to achieve adequate deposition. At the same time HDP CVD process pressures need to be relatively low for the plasma to operate properly—that is at high densities.

To deposit or etch conductive or metal films using HDP processes, the plasma must necessarily be generated using inductive coupling. The fabrication by deposition or removal of metal thin films in an inductively coupled high density plasma reactor is desirable because of the advantages it provides, including: lower processing temperatures and higher step coverage, as discussed above, as well as shorter processing times and denser films.

However, in the case of inductively coupled (IC) plasma procedures there is no capacitive coupling to the chamber walls, and any conductive material deposition on the chamber walls blocks the inductive power coupling to the plasma. For the deposition of conductive materials and metal films this means that the reactor chamber walls must be cleaned quite frequently in order to prevent the deposition of conductive materials on the chamber walls which blocks the IC plasma fabrication steps.

Traditionally the only way to remove ionic and metallic contaminants from any plasma reaction chamber or furnace tube has been to clean the tubes with wet etching, often with the simple method of manually rolling them, half submerged, in an acid bath. Cleaning of the reaction chamber in this manner involves removing the dirty quartz tube, install a previously cleaned tube, and cleaning the dirty tube for future use. This method of cleaning is unsatisfactory for many reasons. Tearing down a furnace is a time consuming and difficult process that requires from 4–24 hours and has been likened to "open heart surgery". It requires not merely a tube change, but also a particle and process requalification of the furnace. The result is that any cleaning regime selected must balance the need to clean the furnace tube with the potential product yield loss and furnace downtime. In addition, a very significant disadvantage of any wet clean process is the increasingly strict regulatory controls placed on wet chemical disposal making it increasingly more costly and troublesome.

Several in-situ cleaning options exist for other CVD systems but metal and other conductive material contamination cannot be removed completely with any of the existing methods. Any conductive deposition on the chamber walls in an IC plasma system blocks the power coupling to the plasma. The significance of this is that in the specific case of inductively coupled plasma chambers, since there is no capacitive coupling to the chamber walls, cleaning by generating a plasma containing an etchant gas to remove conductive material is not possible. With the growing need for more frequent cleaning of furnace tubes, as is the case when using IC PECVD to deposit metals and conductive films an alternative cleaning method is still needed.

SUMMARY OF THE INVENTION

The present invention is a process for plasma enhanced fabrication of conductive materials on a semiconductor substrate comprising the steps of placing the substrate in an inductively coupled (IC) plasma reaction chamber and maintaining the chamber under vacuum pressure while introducing at least a preselected reactant species gas, and optionally a carrier gas into the chamber for a preselected fabrication procedure on the substrate. A plasma is generated from the gas or gases within the chamber using a power source inductively coupled to the reaction chamber. After the consequent fabrication procedure the substrate is removed from the chamber, and any conductive material is in-situ removed from the inside of the chamber to remove any blocking of the inductive power couple to the reaction chamber.

In one embodiment the in-situ removal of conductive material from the inside of the reaction chamber is accomplished by the introduction of a remotely created plasma, which provides the necessary activated reactive species to carry out this step. The activated reactive species are created in a separate plasma reaction chamber, which is remote and separate from the inductively coupled PECVD chamber and then transported downstream and introduced into the reaction chamber to remove conductive material from the inside of the reaction chamber.

In another embodiment the in-situ removal of conductive material is accomplished employing low temperature etching by the introduction of suitable etchant gases into the chamber. Suitable gases for etching the conductive materials, such as metals, contained in the fabrication step include, for example, compounds such as $ClF_3$, other polyhalogen compounds or $NF_3$.

Additional advantages and novel features of the invention will be set forth in part in the description that follows, and in part will become apparent to those skilled in the art upon examination of the following or may be learned by practice of the invention.

DESCRIPTION OF THE FIGURES

FIG. 3 is a schematic drawing of another process chamber suitable for use with an exemplary embodiment of the current invention.

DETAILED DESCRIPTION

Figure 1:
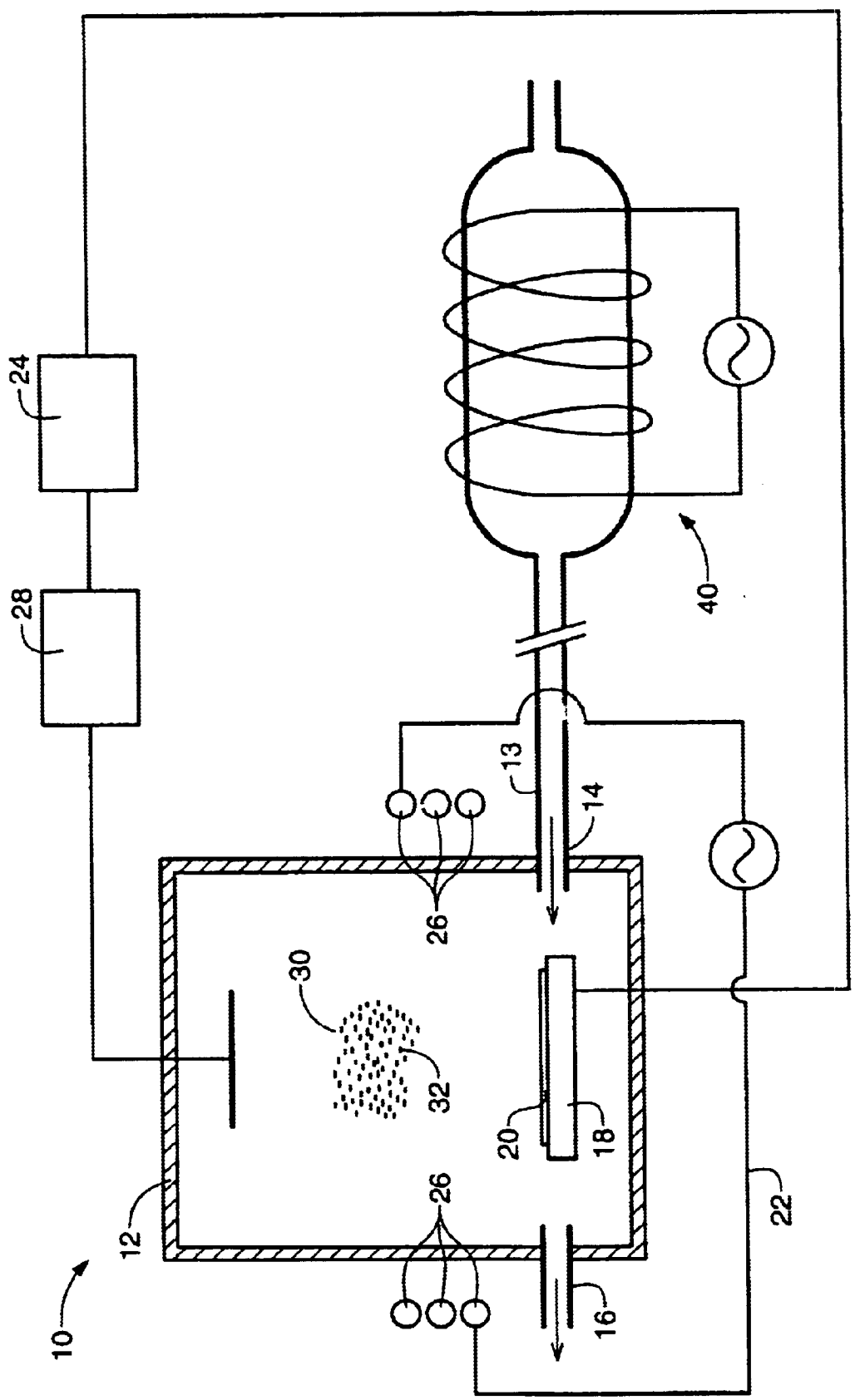
FIG. 1 is a schematic drawing of an exemplary inductively coupled plasma-enhanced chemical vapor deposition chamber suitable for use with the process of this invention.

The present invention, broadly stated, is directed to plasma enhanced fabrication processes. The invented process permits the in-situ removal of conductive material from the inside of an inductively coupled plasma chamber. In general, for any fabrication procedure or step that utilizes a plasma or glow discharge in an inductively coupled reaction chamber and involves a conductive material, the selected fabrication step may be completed and followed by in-situ removal of conductive material from the inside of the inductively coupled plasma reaction chamber. Because of the nature of glow discharges or plasmas and conductive material, for example metals, such plasma enhanced processes must necessarily be carried out in an inductively coupled (IC) reaction chamber. The invention is particularly well-suited to processes that use metal-containing compounds and/or high density plasmas.

A plasma enhanced chemical vapor deposition (PECVD) process is described in detail to illustrate the utility of the process. The process is equally suited to any other process that uses a plasma in an inductively coupled reaction chamber and a conductive material. The exemplary embodiment using PECVD is not intended to limit the scope of the present invention to PECVD processes. Other appropriate processes for the present invention include, for example, plasma enhanced directional sputtering, etching of metals with high density plasma, surface conditioning treatments, and the like.

For PECVD metal film deposition in an IC chemical vapor deposition (CVD) reactor, the process of the invention, generally stated, includes the steps of: placing the substrate in a IC CVD reaction chamber under a preselected vacuum pressure; introducing a preselected composition of processing gas into the reaction chamber for metal deposition on the substrate; and generating a high density plasma from the gas within the reaction chamber using a power source inductively coupled to the reaction chamber; removing the substrate from the reaction chamber; and in-situ removal of conductive films from the inside of the chamber, to remove blocking of the inductive power couple to the reaction chamber. The in-situ chamber cleaning is accomplished by either introduction of activated reactive compounds, preferably contained in a remotely formed plasma for etching conductive materials or by introduction of gases for etching conductive materials.

The in-situ chamber cleaning process can be performed in any system for inductively coupled (IC) plasma enhanced (PE) fabrication processes. An IC high density plasma (HDP) system is described below and shown in FIG. 1 and is generally designated as 10. It is to be understood that the apparatus and embodiments described herein are meant to be a non-limiting examples to illustrate the process claimed in this invention.

A radio-frequency inductively coupled type of PECVD apparatus is provided with: a reaction chamber 12 that has a gas inlet port 14 in flow communication with a source, which is not shown, for supplying a metal precursor deposition gas 30 and a gas exhaust port 16 in flow communication with a source of vacuum for exhaust gas from chamber 12 and for maintaining a predetermined degree of vacuum therein. System 10 further includes a plasma generation means 22 arranged on an upper surface of reaction chamber 12; and a holder device 18 that holds a substrate 20, typically a semiconductor wafer, on which the metal deposition process step is performed in the plasma produced by the plasma generation means 22. Reaction chamber 12 is formed from an insulating material that is transparent to radio-frequency waves, for example quartz.

Plasma generation means 22 in this example includes a radio-frequency power source to three-turn antenna 26. Radio-frequency waves are generated inside reaction chamber 12 from antenna 26, and metal precursor deposition gas 30 is activated by this electromagnetic energy to cause the generation of a plasma.

Optionally, as shown in FIG. 1, is a common configuration for holder device 18; here a susceptor, such that another radio-frequency power source 24 is connected thereto with a matching circuit 28 therebetween; radio-frequency electric power is supplied from this radio-frequency power source, and a self-bias potential is maintained with respect to the plasma's potential, via a blocking capacitor (not shown).

A source of conductive material, here metal precursor deposition gas 30, can be appropriately coupled to inlet port 14, through which deposition gas 30 is introduced into chamber 12. Optionally, a supply of carrier gas 32 can be added to metal precursor deposition gas 30 by inclusion of a suitable gas premix system that is likewise coupled to enter chamber 12 through suitable valving. Carrier gas 32 may include argon, helium and other suitable inert gases. With this arrangement inert carrier gas 32 and metal precursor deposition gas 30 can be combined prior to introduction into reaction chamber 12. The temperatures and flow rates of the gases can be controlled to achieve the desired reaction and film quality.

The flow rates of metal precursor deposition gas 30 and carrier gas 32 also have a significant effect on the deposited film. For a IC HDP reactor 10, as described above process temperatures in the range of 200° C. to 800° C. can be utilized. Process pressures for such an IC HDP reactor 10 may be in the range of 1 m Torr to 10 m Torr and with gas flow rates in the range of 100 to 800 sccm's (standard cubic centimeters per minute).

Power from radio-frequency power source 22, typically is in the range of 50 to 150 watts with a frequency of the order of 13.56 MHz. Radio-frequency waves are generated with reaction chamber 12 from antenna 26. This electromagnetic energy excites deposition gas 30 and optionally carrier gas 32, now resident in chamber 12 to form a plasma, and thus a high-density plasma of, for example, the order of $10^{10}$ to $10^{16}$ ion/cm$^3$ is generated.

An example of a metal film that can be deposited using this process is titanium. In the deposition of a titanium metal film using this invention a desirable precursor deposition gas can be formed from titanium tetrachloride ($TiCl_4$). Argon can be used as a carrier gas and bubbled through the $TiCl_4$ to form the gas. Alternatively, a precursor deposition gas for titanium may be selected from any suitable titanium source, including for example, titanium tetrabromide, titanium tetraiodide, tetrakis (diethylamino) titanium and tetrakis (diethylamino) titanium.

The method of the invention is equally suitable for the deposition, conditioning, doping and etching of other metal and conductive films and suitable precursors for the selected fabrication reaction can be formed from an organic or inorganic metal source, as dictated by the characteristics desired in the selected fabrication step. In the titanium deposition example, substrate 20 is placed on holder 18 inside reaction chamber 12 and vacuum pressure is established by a vacuum pump, not shown, that is in flow communication with exhaust port 16. The $TiCl_4$, hydrogen and argon gas are then introduced into reaction chamber 12 through inlet port 14. A plasma is generated by application of radio-frequency power source 22, as described above and a metal film is formed on the surface of substrate 20. Substrate 20 is then removed from reaction chamber 12 and any deposition of metal on the inside of reaction chamber 12 can then be removed in-situ to eliminate any blocking of the inductive power couple to reaction chamber 12. Chamber 12 is then ready for another substrate 20 for the selected fabrication procedure, here metal deposition.

In one illustrative embodiment the in-situ removal of conductive material from the inside of reaction chamber 12 is accomplished by the introduction of a remotely created plasma, which provides the necessary activated reactive species to carry out this step. Here reactive species includes ionized species and neutral species in high energy states. To accomplish this, the reactive species are created in separate plasma reaction chamber 40, which is remote and separate from inductively coupled PECVD chamber 12 and then transported downstream and introduced into reaction chamber 12 to etch conductive material from the inside of chamber 12. This requires remote plasma chamber 40 to be in flow communication by way of inlet port 14 with reaction chamber 12. In the present example, the plasma for in-situ cleaning is generated in remote plasma chamber 40 and moved to reaction chamber 12 through conduit 13 to inlet port 14. The plasma containing the reactive etchant species can be generated in remote plasma chamber 40, by any suitable means to create the reactive species necessary for the in-situ cleaning step of the invention. Means for generating such a plasma are well known in the art and include, for example, a pair of oppositely placed electrodes, inductive coils, microwave sources, and other conductive and inductive power sources. In this example a plasma is the preferred means for creating the activated reactant species, but they can also be created using other suitable means, such as optical activation, thermal activation, ultrasonic activation and the like.

In another illustrative embodiment the in-situ removal of conductive material from the inside of reaction chamber 12 is accomplished employing low temperature etching by the introduction of suitable etchant gases into chamber 12 through inlet port 14. Suitable gases for etching the metals contained in the metal deposition step include, for example, compounds such as $ClF_3$, other polyhalogen compounds or $NF_3$. Additional examples of compounds suitable for etching the metals contained in the metal deposition step are listed elsewhere is this description In any embodiment the in-situ removal of conductive material from the inside of reaction chamber 12 is accomplished in the same manner after the preselected fabrication procedure. Whether the selected fabrication procedure is sputtering, etching or otherwise conditioning substrate 20, the selected fabrication step is then followed by in-situ cleaning of reaction chamber 12. For any preselected fabrication procedure the in-situ removal of conductive material from the inside surface of inductively coupled chamber 12 is accomplished by either introduction of a remotely formed plasma containing reactive compounds for etching conductive materials or by introduction of gases for etching conductive materials.

Figure 2:
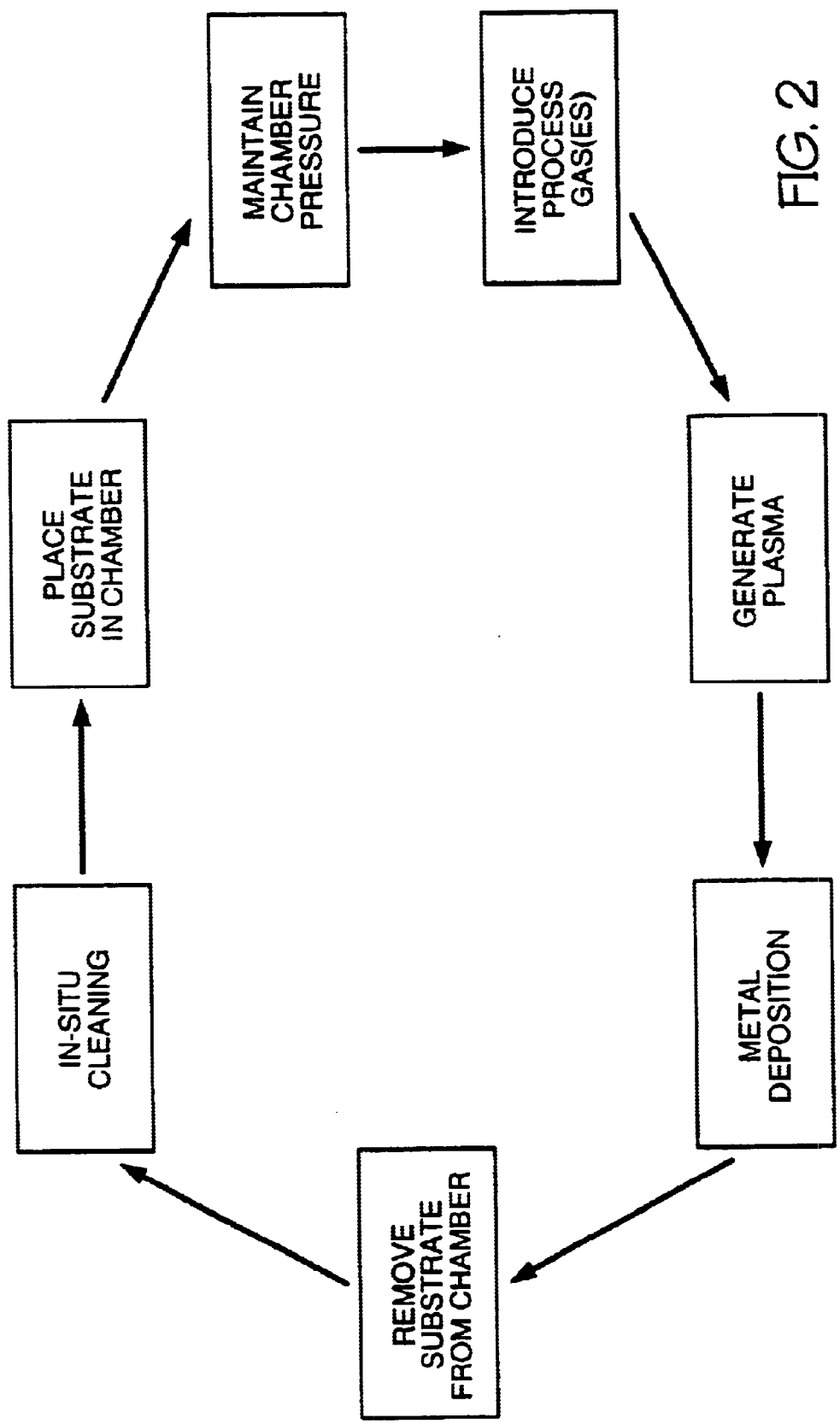
FIG. 2 is a flow chart of the steps for the given embodiment of the process of this invention.

In any embodiment of the invention, after the in-situ removal of the conductive material from the inside of reaction chamber 12 has been accomplished, the etchant-containing species can then be pumped out of reaction chamber 12 through exhaust port 16. Likewise, in any embodiment the in-situ cleaning step may be considered to be performed as either a first step or last step in the metal deposition process claimed herein, as shown in FIG. 2.

Turning now to the etchant gas sources for the in-situ cleaning step in any embodiment of the inventive process, they can be provided in any form that produces the desirable reactive species relative to the metal or conductive material that needs to be removed from the inside of chamber 12 in order to remove any blocking of the inductive power couple to reaction chamber 12. Typical examples of suitable etchant compounds include fluorine, chlorine, bromine, hydrogen chloride, hydrogen fluoride, hydrogen bromide, sulphur hexafluoride, nitrogen trifluoride, carbon tetrachloride ($CCl_4$), carbon tetrafluoride ($CF_4$), chlorine monofluoride (ClF), chlorine trifluoride ($ClF_3$), bromine chloride (BrCl), bromine monofluoride (BrF), bromine trifluoride ($BrF_3$), bromine pentafluoride ($BrF_5$), iodine monobromide (IBr), iodine tribromide ($IBr_3$), iodine monochloride (ICl; alpha and beta), iodine trichloride ($ICl_3$), iodine pentafluoride ($IF_5$), iodine heptafluoride ($IF_7$), carbon dichlorodifluoride ($CCl_2F_2$), other halogen and polyhalogen compounds and the like. The etchant source gases can be provided in either a gas phase or as liquid source converted to the gas phase through a bubbler system.

In conclusion, this plasma enhanced method for fabrication procedures that involve conductive material, using an inductively coupled plasma chamber with in-situ cleaning of the reaction chamber provides many advantages. These advantages include, for example, improved film condition and quality, in terms of step coverage, film density and multi-layer integrity. This invention provides a method for fabrication procedures for semiconductor substrates involving conductive material and employing a plasma for the smaller geometries that are now crucial to device functionality. This invention allows inductively coupled plasma chambers to be cleaned without dismantling, re-assembling and recertifying the plasma chambers.

In addition to the chamber depicted in FIG. 1, embodiments within the scope of the current invention apply to other types of processing chambers as well, including the one depicted in FIG. 3. In that figure, system 100 includes a plasma generator 108 and a furnace tube 102. The furnace tube 102 comprises a ceramic shell 104 around a quartz tube 106 and is configured to hold substrate 20. Coupling the furnace tube 102 to a remote plasma chamber 40 allows for cleaning methods as described above. Other examples of the advantages provided by this invention include higher system throughput and reduced chemical disposal costs and other economic benefits.

It is intended that alternate embodiments of the inventive concepts are possible without departing from the scope of the invention as expressed in the following claims.

We claim:

1. A plasma processing system, comprising:
   a first chamber configured to generate a first plasma therein; and
   a second chamber coupled to said first chamber, wherein said second chamber is configured to initially generate a second plasma therein, further configured to lose an ability to generate said second plasma, and configured to receive said first plasma, wherein said first plasma is configured to restore said ability.

2. The system in claim 1, wherein said second chamber is configured to lose said ability in response to a generation of said second plasma, and further configured to regain said ability in response to a reception of said first plasma.

3. The system in claim 2, wherein said second chamber is a tube furnace.

4. The system in claim 3, wherein said first chamber is a tube furnace.

5. A furnace assembly, comprising:
   a structure defining a furnace interior, wherein at least a part of said structure is transparent to a radio-frequency wave, wherein said structure is configured to receive a first material that is opaque to said wave, and wherein said structure is configured to interpose between a source of said wave and said first material; and
   a delivery system in fluid communication with said interior defined by said structure, said system configured to deliver a second material to said first material, wherein said second material is reactable with said first material.

6. The furnace assembly in claim 5, wherein said delivery system is configured to deliver an etchant.

7. The furnace assembly in claim 6, wherein said delivery system is configured to deliver a second material selected from a group consisting of fluorine, chlorine, bromine, hydrogen chloride, hydrogen fluoride, hydrogen bromide, sulfur hexafluoride, nitrogen trifluoride, carbon tetrachloride ($CCl_4$), carbon tetrafluoride ($CF_4$), chlorine monofluoride (ClF), chlorine trifluoride ($ClF_3$), bromine chloride (BrCl), bromine monofluoride (BrF), bromine trifluoride ($BrF_3$), bromine pentafluoride ($BrF_5$), iodine monobromide (IBr), iodine tribromide ($IBr_3$), iodine monochloride (ICl; alpha and beta), iodine trichloride ($ICl_3$), iodine pentafluoride ($IF_5$), iodine heptafluoride ($IF_7$), carbon dichlorodifluoride ($CCl_2F_2$), and $NF_3$.

8. The furnace assembly in claim 6, wherein said delivery system is configured to deliver a halogen.

9. The furnace assembly in claim 8, wherein said delivery system is configured to deliver a polyhalogen.

10. A semiconductor fabrication system, comprising:
    a first reaction device configured to inductively generate a first plasma, wherein said first plasma comprises an induction blocker, and wherein said first reaction device is further configured to accept said induction blocker in an area that blocks plasma induction; and
    a component coupled to said first reaction device and configured to provide said first reaction device with an induction blocker remover.

11. The semiconductor fabrication system in claim 10, wherein said component is a second reaction device configured to generate a second plasma comprising said induction blocker remover.

12. The semiconductor fabrication system in claim 11, wherein said first reaction device comprises a quartz component having an interior defining a plasma induction region; and wherein said quartz component is configured to accept said induction blocker thereon.

13. The semiconductor fabrication system in claim 12, wherein said second reaction device is configured to generate a second plasma comprising a conductive material remover.

14. A cleaning apparatus for an inductively-coupled plasma chamber, comprising:
    a conduit configured to couple to said inductively-coupled plasma chamber; and
    a cleaning chamber coupled to said conduit and configured to provide a metal-cleaning gas to said inductively-coupled plasma chamber through said conduit.

15. The cleaning apparatus of claim 14, further comprising a plasma-generation device around said cleaning chamber, wherein said plasma-generation device is configured to inductively generate a metal-etching plasma within said cleaning chamber.

16. The cleaning apparatus in claim 15, wherein said cleaning chamber is configured to provide said metal-etching plasma to said inductively-coupled plasma chamber through said conduit.

17. A wafer processing system, comprising:
    a reactor having a wafer fabrication mode and a reactor cleaning mode, wherein said reactor is configured to receive a metal-containing gas during said wafer fabrication mode, locally generate a plasma during said wafer fabrication mode, receive a metal etchant during said reactor cleaning mode, and refrain from locally generating a plasma during said reactor cleaning mode; and a chamber configured to couple to said reactor during said reactor cleaning mode and further configured to temporarily house said metal etchant.

18. The system in claim 17, wherein an interior of said reactor is free of any wafer during said reactor cleaning mode.

19. The system in claim 18, wherein said chamber is configured to transmit said metal etchant in a non-plasma form to said reactor during said cleaning mode.

20. A metal processing system, comprising:

a furnace comprising a quartz tube and configured to house a high-density plasma and to allow deposition of a metal on said quartz tube and on a wafer located inside said quartz tube; and a cleaning chamber coupled to said furnace and configured to house a gas that is configured to etch said metal from said quartz tube.

21. The system in claim 20, wherein said furnace is configured to allow said gas to access said quartz tube to the exclusion of said wafer.

22. The system in claim 21, wherein said furnace is configured to allow said gas to access said quartz tube in response to a removal of said wafer from said furnace.

23. A plasma-generation system, comprising:

a first plasma chamber;

a second plasma chamber having a deposition mode and a cleaning mode, wherein said second plasma chamber comprises:
   a housing defining a process area and coupled to said first plasma chamber, and
   a plasma inducer around said housing; and
a conductive material present after said deposition mode between said process area and said inducer.

24. The system in claim 23, wherein said conductive material is between said process area and said housing.

25. The system in claim 24, wherein said conductive material is absent after said cleaning mode.

26. The system in claim 25, wherein said conductive material is absent before said deposition mode.

27. A furnace assembly, comprising:

a first material that is opaque to a type of energy;

a structure defining a furnace interior, wherein at least a part of said structure is transparent to said energy, wherein said part contacts said first material, and wherein said structure is configured to interpose between a source of said energy and said first material; and a plasma delivery system in fluid communication with said interior defined by said structure.

28. The assembly in claim 27, wherein said first material is present before said plasma delivery system is active.

29. The assembly in claim 28, wherein said first material is opaque to a radio-frequency wave.

* * * * *

UNITED STATES PATENT AND TRADEMARK OFFICE
CERTIFICATE OF CORRECTION

PATENT NO. : 6,749,717 B1
DATED : June 15, 2004
INVENTOR(S) : Gurtej S. Sandhu

It is certified that error appears in the above-identified patent and that said Letters Patent is hereby corrected as shown below:

Title page,
Item [63], Related U.S. Application Data, delete "-in part."

Column 1,
Line 21, add a comma -- , -- after the term "semiconductors."

Column 2,
Line 49, replace "install" with -- installing --.

Column 3,
Line 22, replace the comma "," with a semicolon -- ; --.

Column 4,
Line 50, replace "exhaust" with -- exhausting --.

Column 5,
Line 45, replace "diethylamino" with -- dimethylamino --.

Column 6,
Line 36, add a period -- . -- after the term "description;"
Line 66, replace "sulphur" with -- sulfur --.

Signed and Sealed this

Twenty-third Day of November, 2004

JON W. DUDAS
*Director of the United States Patent and Trademark Office*